United States Patent
Tatum (10) Patent No.: US 7,638,351 B2
(45) Date of Patent: Dec. 29, 2009

(54) PHOTODIODE WITH FIBER MODE DISPERSION COMPENSATION

(75) Inventor: Jimmy A. Tatum, Plano, TX (US)

(73) Assignee: Finisar Corporation, Sunnyvale, CA (US)

( * ) Notice: Subject to any disclaimer, the term of this patent is extended or adjusted under 35 U.S.C. 154(b) by 161 days.

(21) Appl. No.: 11/185,038

(22) Filed: Jul. 20, 2005

(65) Prior Publication Data

US 2006/0183264 A1    Aug. 17, 2006

Related U.S. Application Data

(60) Provisional application No. 60/653,747, filed on Feb. 16, 2005.

(51) Int. Cl.
  *H01L 21/04* (2006.01)
(52) U.S. Cl. .................. 438/57; 438/59; 257/461; 257/462; 257/463; 257/464; 257/465; 257/E31.011; 257/E31.014; 257/E31.107; 398/143; 398/144; 398/202; 398/214
(58) Field of Classification Search ................ 257/225, 257/184, 185, 186, 187, 188, 289, 440, 459, 257/457, 461–465, 21, E31.107, E31.011, 257/E31.014; 438/57, 59; 398/141, 214, 398/210, 204, 203, 202, 143, 144
See application file for complete search history.

(56) References Cited

U.S. PATENT DOCUMENTS 6,002,142 A * 12/1999 Paoli .......................... 257/21

OTHER PUBLICATIONS

Patel, enhanced multimode fiber link performance using a spatically resolved receiver, IEEE, pp. 393-395, 2002.*
Patel, Ketan M. and Ralph, Stephen E. *MMF Reach Extension for 10 Gbps by Spatially Resolved Equalization*, Georgia Institute of Technology School of Electrical and Computer Engineering, Atlanta, GA 2004.

* cited by examiner

*Primary Examiner*—Kiesha L. Rose
*Assistant Examiner*—Minchul Yang
(74) *Attorney, Agent, or Firm*—Workman Nydegger

(57) ABSTRACT

A photodiode and a method of fabricating a photodiode for reducing modal dispersion and increasing travel distance. The central region of the photodiode is made less responsive to incident light than a peripheral region of the photodiode. The less responsive central region discriminates the lower order modes such that only the higher order modes are incident on the more responsive peripheral region. Because the lower order modes are subtracted, the range of propagation constants is reduced and modal dispersion is also reduced.

17 Claims, 7 Drawing Sheets

PHOTODIODE WITH FIBER MODE DISPERSION COMPENSATION

CROSS-REFERENCE TO RELATED APPLICATIONS

This application claims the benefit of U.S. Provisional Application No. 60/653,747, titled Photodiode with Fiber Mode Dispersion Compensation filed Feb. 16, 2005, which is incorporated herein by reference.

BACKGROUND OF THE INVENTION

1. The Field of the Invention

The present invention relates in general to the fabrication of a photodiode to achieve fiber modal compensation in optical fiber systems.

2. Description of the Related Art

In an optical communication system that includes a multimode fiber (MMF), an optical signal launched into a fiber propagates along the fiber in multiple mode groups, each of which exhibits a different group velocity. Portions of the source optical signal reside in the different mode groups. Each of the mode groups can have different arrival times at the end of the fiber due to the different group velocities. The different group velocities of the mode groups cause a pulse, representing a binary symbol, formed from more than one mode group to spread out as it propagates. This is because portions of the symbol travel faster than other portions of the symbol. This is referred to as modal dispersion. Modal dispersion causes the optical signal initially launched through a fiber at a predetermined frequency and an initial phase to vary as a function of the length of the fiber.

Modal dispersion reduces the maximum data transmission rate of the optical communication system and thus diminishes the total transmission capacity of the fiber. This results at least in part from the fact that modal dispersion spreads the optical pulse as it propagates. Adjacent pulses may spread into each other causing intersymbol interference. Short pulses typically also include short times between pulses and thus are limited to very short transmission distances to prevent or minimize intersymbol interference. Longer pulses can be transmitted further because the relative distortion of the pulse is smaller and distance between pulses is greater. Shorter pulses typically require more bandwidth for propagation. A common specification criteria for multimode fiber is a bandwidth-distance product. Importantly, the bandwidth-distance products of typical multimode fiber are severely limiting. Typically the fiber bandwidth is specified using a light launching condition that fills all of the modes of the optical fiber.

Modem multimode fiber incorporates a graded optical index profile within the core of the fiber to reduce modal dispersion. This is done by engineering the index profile of the graded region, typically in the shape of a parabola along the transverse dimension of the optical fiber. However, manufacturing variances and defects such as uncontrolled changes in grading profiles, a so called "alpha change", or index peaking or dipping in the center, lead to variances in the fiber modal bandwidth. Modal dispersion remains the dominant bandwidth limiting mechanism in multimode fibers. These deviations can lead to significant variations in the optical bandwidth of the fiber depending on which mode groups are excited in the launching condition. Furthermore, as compared to single mode fibers, these limits reduce the capacity of multimode fiber by orders of magnitude.

The different propagation velocities of the distinct optical mode groups can lead to large differential mode delay (DMD) in multimode fibers. The severity of this modal dispersion can limit multimode fiber links to bandwidth-distance products of a few tens of MHz-kilometers depending on the original mode excitations.

The mode groups inside the fiber are characterized with different divergences at the distal end of the optical fiber. Specifically, higher order mode groups have a wider divergence angle than lower order mode groups. Stated differently, when higher order mode groups exit a multimode fiber onto a detector, such as a photodiode, the higher order modes will impinge the detector within a larger radius than the lower order modes.

Therefore, it is possible to spatially separate the various mode groups in the optical fiber, and by appropriate reconstruction and delays, correct the effects of modal dispersion in the fiber.

In practice it is often sufficient to only spatially resolve two areas, the inner and outer portion. Electronic compensation of the fiber modal dispersion can then be used to restore the signal integrity. This has been demonstrated to improve the bandwidth of the optical system. In previously described systems, a photodiode has been fabricated with two concentric active regions. The response of the two active regions can be subtracted electronically to reduce the effects of the modal dispersion. The approach therein is to use a Metal-Semiconductor-Metal (MSM) photodiode with two active areas. However, this has the disadvantage of requiring complex fabrication technology, and external subtraction circuits to operate effectively.

Thus, a need exists in the industry to address the aforementioned and/or other deficiencies and/or inadequacies.

BRIEF SUMMARY OF THE INVENTION

Briefly described, one embodiment of the invention can be implemented as a system that includes a photodiode fabricated with two regions: a central region that is rendered optically dead by deep proton implantation, and a peripheral region. The photodiode is coupled to an end of an optical fiber for detecting optical signals exiting the optical fiber and for converting the optical signals to an electrical output. The central region of the photodiode intercepts a mode in a manner distinct from the peripheral regions. The system also includes reception of a resultant signal output from the photodiode regions and forwarding the signal to circuitry.

The present invention can also be embodied as a method that, in one embodiment, includes the following steps: forming an n-type layer on the semiconductor substrate, forming an intrinsic layer on the n-type layer, forming a p-type layer on the intrinsic layer, and rendering the photodiode less responsive to incident light on the central region than to incident light on the peripheral region. The photodiode detects different portions of a plurality of optical signals radiating from an end of a multi-mode fiber. The effect of the central region is to reduce the effects of modal dispersion among the plurality of optical signals by selectively reducing the response to particular mode groups of the fiber.

Embodiments of the invention may also be described in terms of method for receiving and processing optical signals. For example, one embodiment includes a method for receiving information through a multimode fiber. The method includes receiving an optical signal having higher order mode groups and lower order mode groups from the multimode fiber onto a surface having a central region and a peripheral region. The lower order mode groups are incident on the central region. The higher order mode groups have portions that are incident on the peripheral region. The method further includes generating an output electrical signal in response to incident light on the peripheral region. The method includes being less responsive to incident light on the central region than to incident light on the peripheral region. Advantageously, this embodiment allows for modal dispersion to be reduced by implementing a system that effectively subtracts the lower order mode groups from the received optical signal.

These and other advantages and features of the present invention will become more fully apparent from the following description and appended claims, or may be learned by the practice of the invention as set forth hereinafter.

BRIEF DESCRIPTION OF THE SEVERAL VIEWS OF THE DRAWINGS

In order that the manner in which the above-recited and other advantages and features of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF THE INVENTION

In an optical communication systems, modal dispersion limits both the bandwidth and the travel distance of the communications system. An optical signal from a laser is launched into a fiber and propagates along the fiber as multiple modes, each of which travels a different path through the fiber. The different mode velocities cause a pulse formed from more than one mode to spread out as it propagates. Each of the modes can have different arrival times at the end of the fiber, resulting in modal dispersion.

Modal dispersion causes each digital pulse of the optical signal launched through a fiber to spread as a function of the length of the fiber. Uncompensated modal dispersion limits the transmission bit rate of a digital communications system because the resultant distortion of the received signal causes high bit rate pulses to merge causing intersymbol interference. Pulses that overlap cannot be reliably distinguished.

Embodiments illustrated herein include photodiode fabrications that functionally perform subtraction of one or more modes so as to reduce dispersion in a received signal.

A photodiode generally includes a p-type semiconductor material connected to an n-type semiconductor material. P-type semiconductor materials differ from intrinsic semiconductor materials in that the p-type semiconductor materials include a dopant that causes the p-type material to naturally include free positive charge carriers, also known as holes. In n-type semiconductor materials, dopants are added to intrinsic semiconductor materials to create semiconductor materials with free negative charge carriers, also known as electrons. Between the n-type semiconductor material and the p-type semiconductor material is an intrinsic region with no net charge carriers. A photon, if it has enough energy, can cause free carriers including a free electron and a free hole to be created in the intrinsic region. This allows a current to flow when the photodiode is reverse biased at an appropriate voltage. Current flowing in the photodiode is proportional to the number of photons and the energy of the photons impinging the intrinsic region.

Deep proton implantation is used in one embodiment to define an optically dead region in the center of the photodiode. Proton implants serve to damage the dead region such that the dead region is not able to generate free carriers when photons impinge the dead region. The optically dead region does the same subtraction of the two fiber modal responses but requires significantly less complex processing and external circuit connections to achieve the desired fiber modal compensation. When light impinges the optically dead region, essentially no free carriers are created. Thus, as shown below, only power from the higher order mode groups are measured while power from low order mode groups are not. This has the net effect of subtracting low order mode group power from the total optical power including the low order mode groups and the high order mode groups. By eliminating one of the mode groups, modal dispersion is decreased by only measuring modes that travel at similar speeds on an optical fiber.

Figures 1A, 1B:
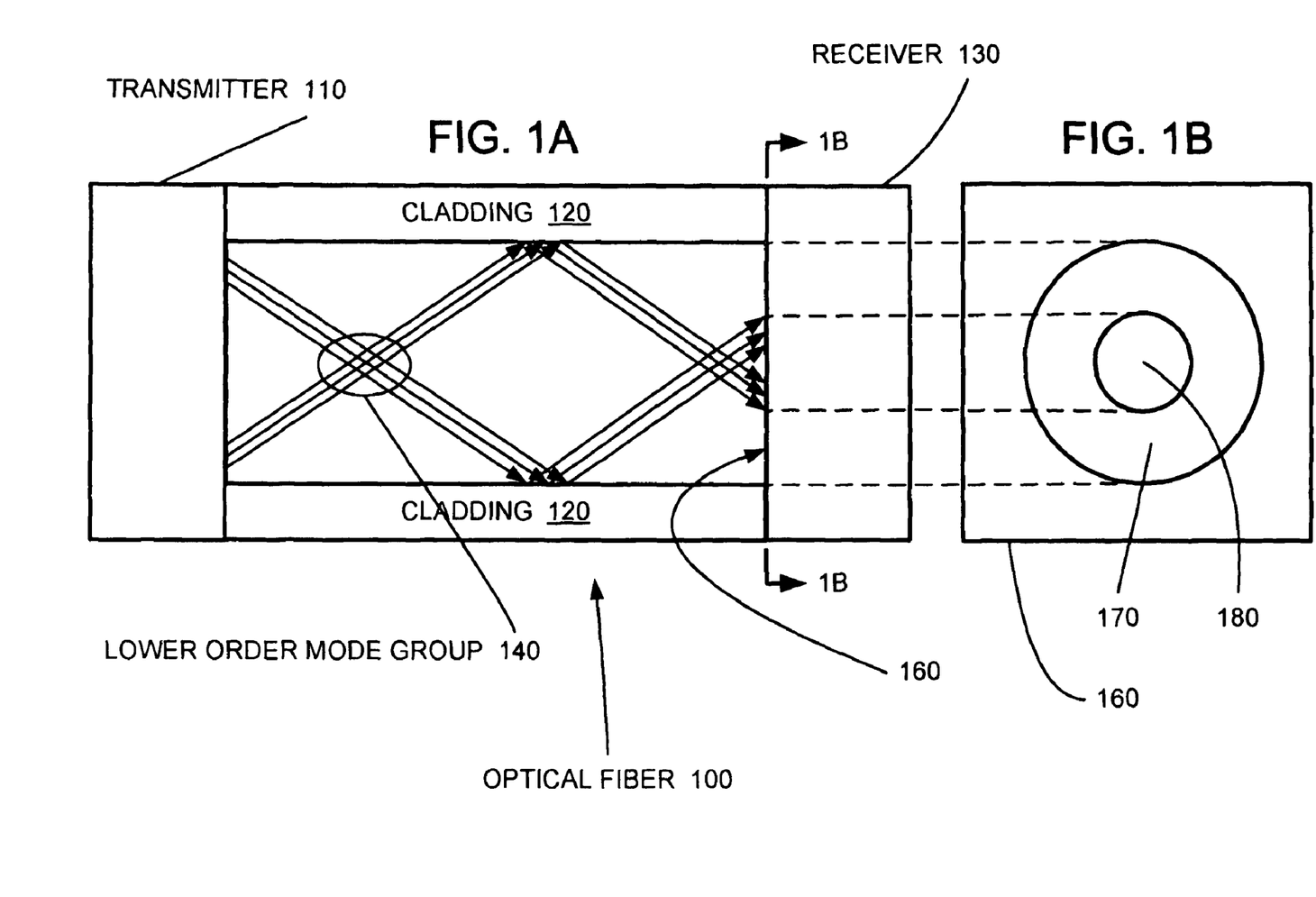
FIGS. 1A and 1B is a schematic diagram of an optical fiber system including a photodiode system having a lower order mode group incident on the central region in accordance with an embodiment of the invention.
Figures 2A, 2B:
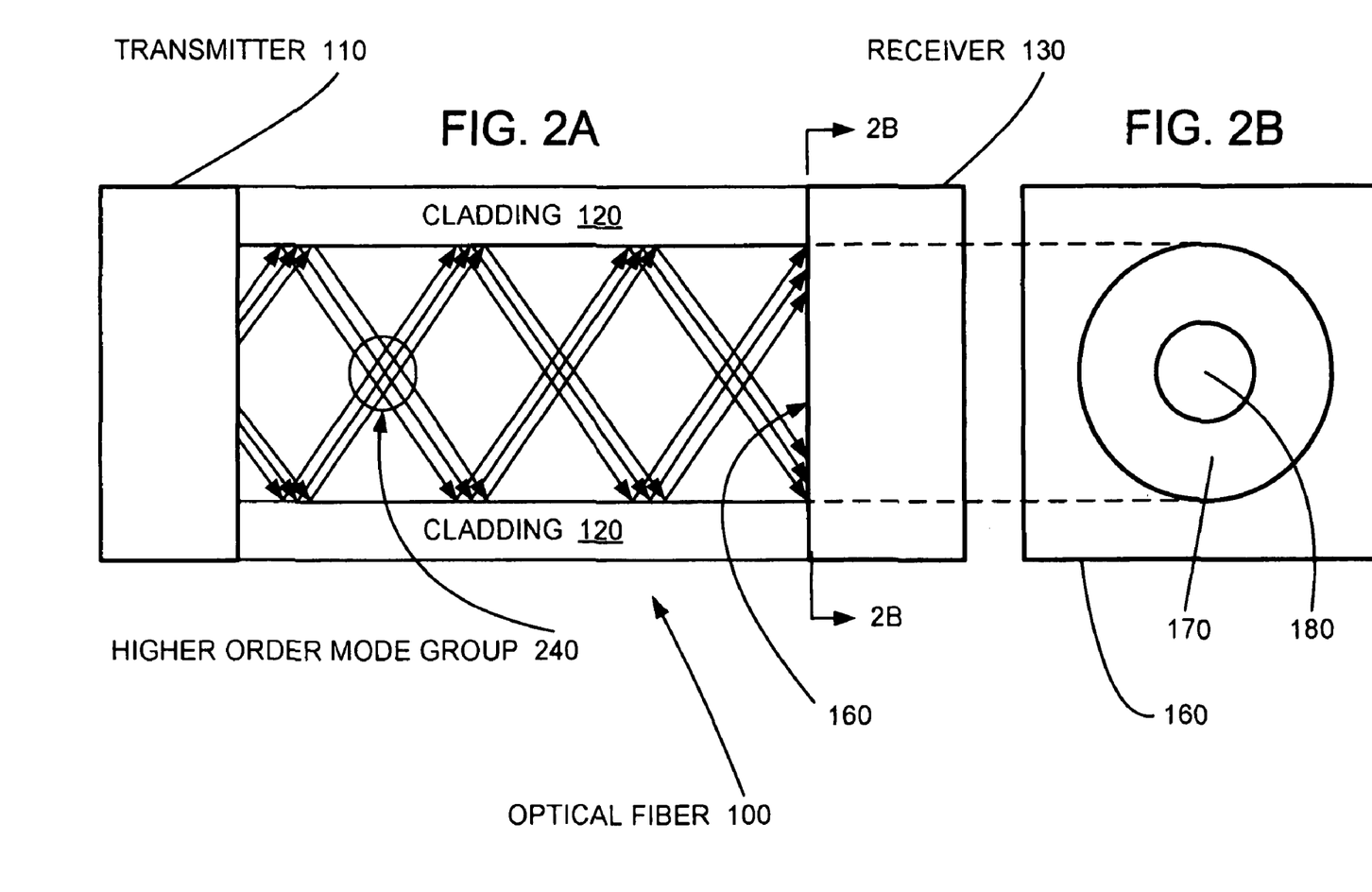
FIGS. 2A and 2B is a schematic diagram of an optical fiber system including a photodiode system having a higher order mode group incident on the peripheral region of the photodiode in accordance with an embodiment of the invention.

FIGS. 1A and 2A depict one embodiment of an optical fiber system of the invention. FIG. 1A illustrates the propagation of a lower order mode group 140 of optical signals through the optical fiber system and FIG. 2A illustrates the propagation of a higher order mode group 240 of optical signals through the optical fiber system. Although the mode groups are depicted in separate figures for the purposes of illustration, both mode groups propagate through the same optical system simultaneously with the lower order mode group 140 arriving before the higher order mode group 240.

FIGS. 1A and 2A are schematic diagrams of an optical fiber system, including a receiver 130 that compensates for modal dispersion. The receiver's surface 160 includes a central region 180 and a peripheral region 170, illustrated in cross-sections of FIGS. 1B and 2B.

An optical fiber system includes a transmitter 110 adapted to transmit information. A digital signal is converted to an optical signal by an electrical-to-optical (E-O) converter which includes the use of a digital-to-analog converter and light source such as a laser. Suitable light sources include a vertical cavity surface emitting laser (VCSEL), light emitting diodes (LED), distributed feedback (DFB) laser, and Fabry-Perot (F-P) lasers. The light source launches an optical signal into a multimode optical fiber 100.

The optical signal propagates through the multimode optical fiber 100 in both lower 140 and higher order 240 mode groups. The higher order mode groups 240 travel a less direct path through the multimode optical fiber 100. The result is that in one example the higher order mode groups 240 travel through the multimode optical fiber 100 at a lower group velocity than the lower order mode groups 140. Therefore, the width of each digital pulse of the optical signal is stretched as it propagates through the multimode optical fiber 100 due to the higher order mode groups 240 falling behind the lower order mode groups 140. The stretching distorts the pulses received at the end of the multimode optical fiber 100 and limits the frequency of the digital pulses. Notably, because of index perturbations, lower order modes may arrive later than higher order modes. In any case, there exists a difference in group velocity that results in modal dispersion.

The receiver 130 is positioned at the end of the multimode optical fiber 100. Referring now to FIGS. 1B and 2B, multiple modes of light exiting from the multimode optical fiber 100 are incident to the surface 160, the surface 160 having a central region 180 and a peripheral region 170. The lower order mode groups 140 are for the most part incident on the central region 180, while the higher order mode groups 240 are incident on the peripheral region 170. The receiver 130 has a surface that is less responsive, or preferably unresponsive, to incident light on a central region 180 than to incident light on a peripheral region 170.

As a result of this process of subtracting the lower order mode groups from the optical signal, the dispersion of the optical signal is compensated for. The receiver 130 outputs an electrical signal that contains the information encoded in the optical signal. In one embodiment, the information is transmitted to a circuit or a computer for further processing.

Figure 3:
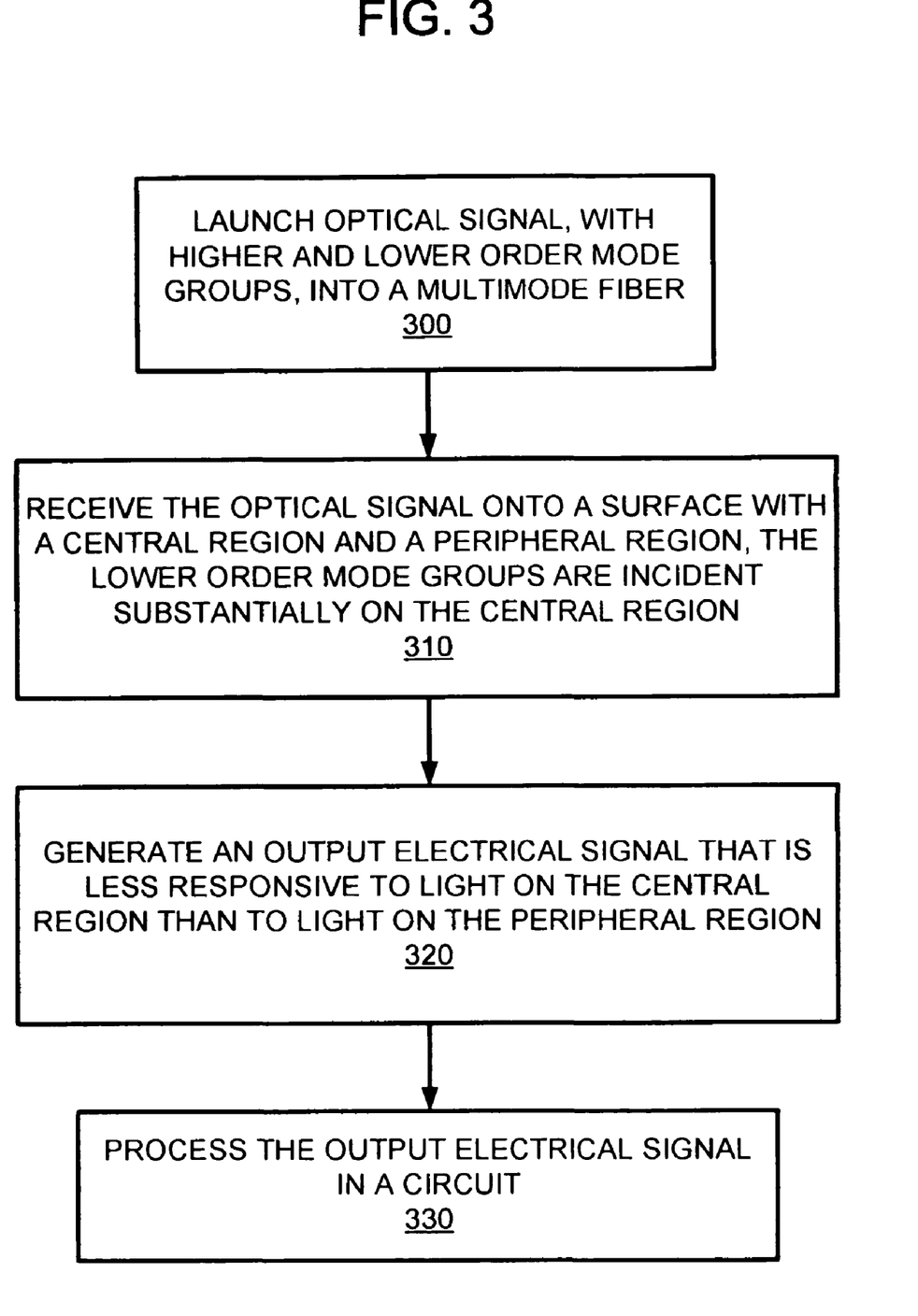
FIG. 3 is a flow chart of a method of fabricating an optoelectrical system in accordance with an embodiment of the invention.

FIG. 3 shows a flow chart of a method of transmitting information in an optical system of the present invention.

At 300, the transmitter launches an optical signal, with high and low order mode groups, into an optical fiber. The propagation of the higher order mode groups along the length of the fiber lags behind the propagation of the lower order mode groups as described herein.

At 310, the optical signal is received onto a surface or a receiver having a central region and a peripheral region. The lower order mode groups are incident substantially on the central region. The higher order mode groups are incident on the peripheral region.

At 320, a generator generates an output signal that is less responsive or unresponsive to light on the central region than to light on the peripheral region. As a result, the output signal is primarily responsive to the higher order mode groups incident on the peripheral region.

At 330, the output electrical signal is processed by a circuit. Processing of the output electrical signal by means of a computer, a signal conditioning circuit, or a decoding device is within the inventive method described herein.

Figure 4:
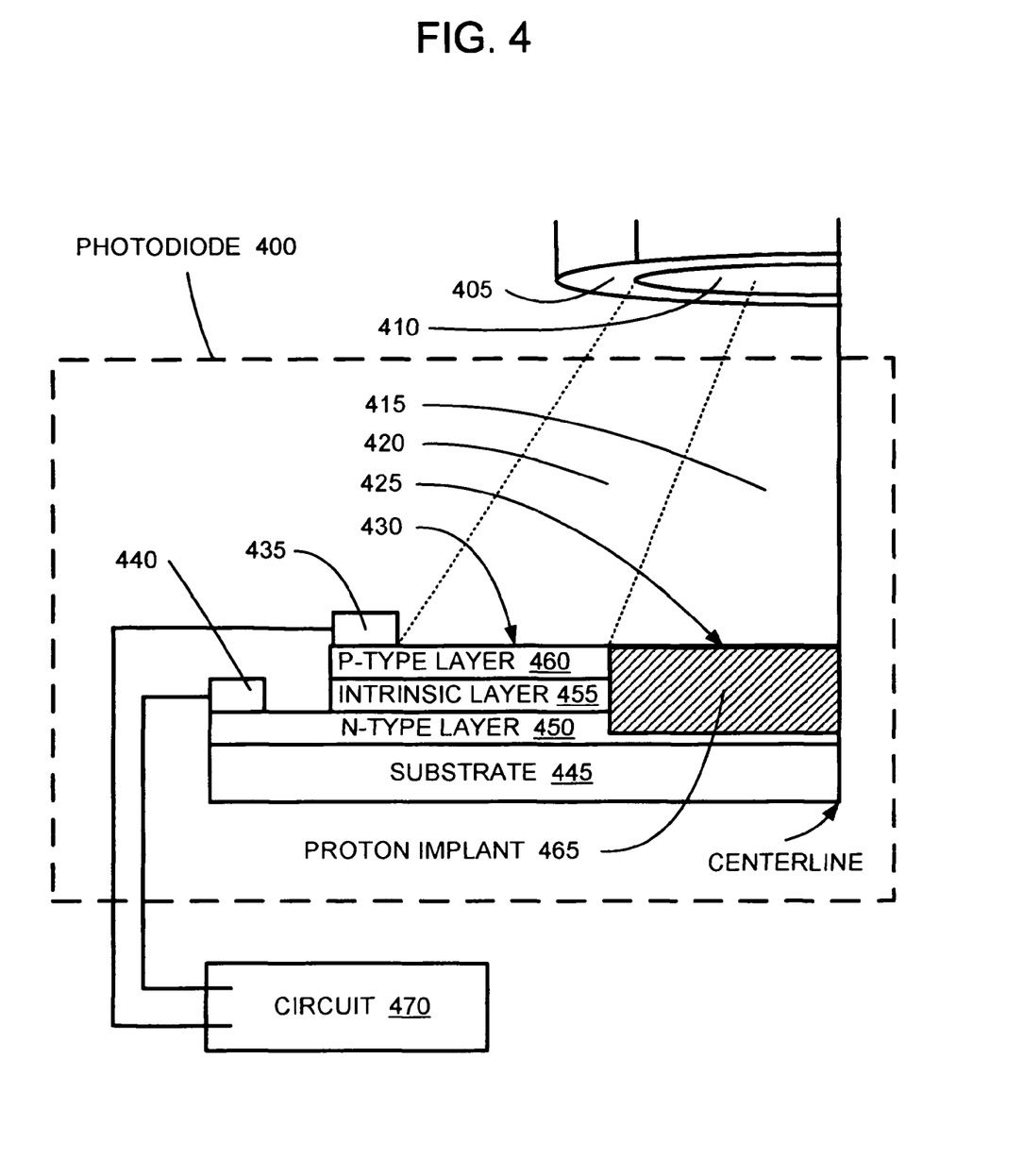
FIG. 4 is a schematic diagram of an optoelectrical system including the photodiode shown in FIGS. 1A, 1B, 2A and 2B, and a circuit for processing the output electrical signal of the photodiode.

FIG. 4 shows an optoelectronic device that includes a photodiode 400 and a circuit 470.

The photodiode 400 comprises a substrate 445, an n-type layer 450 on the substrate 445, an intrinsic layer 455 on the n-type layer 450 and a p-type layer 460 on the intrinsic layer 455. A cathode contact 440 and an anode contact 435 are coupled to the n-type layer 450 and the p-type layer 460, respectively. The photodiode 400 has a surface comprising a central region 425 and a peripheral region 430.

A fiber cable having cladding 405 and a core 410 is configured such that the high order mode groups 420 and low order mode groups 415 are emitted to be incident on the peripheral region 430 and the central region 425, respectively.

The photodiode 400 is rendered less responsive, or completely dead, to incident light on the central region as compared to the incident light on the peripheral region by implanting a proton implant 465 into the central region 425. The proton implant 465 penetrates the central region 425 through the p-type layer 460, the intrinsic layer 455, and at least a portion of the n-type layer 450. Therefore, the receiver 130 responds preferentially to the higher order mode groups 420, and is less responsive to the lower order mode groups 415 because the lower order mode groups 415 are incident on the less responsive central region 425 while the higher order mode groups 420 are incident on the peripheral region 430. Other types of implants may also be used. For example, in one alternative embodiment, an oxygen implant is used to render the photodiode 400 less responsive, or completely dead, to incident light on the central region 425 as compared to the incident light on the peripheral region 430.

The photodiode 400 comprises a circuit 470 coupled to the cathode contact 440 and the anode contact 435. The circuit 470 is configured to process the electrical signal generated by the photodiode 400.

Figure 5:
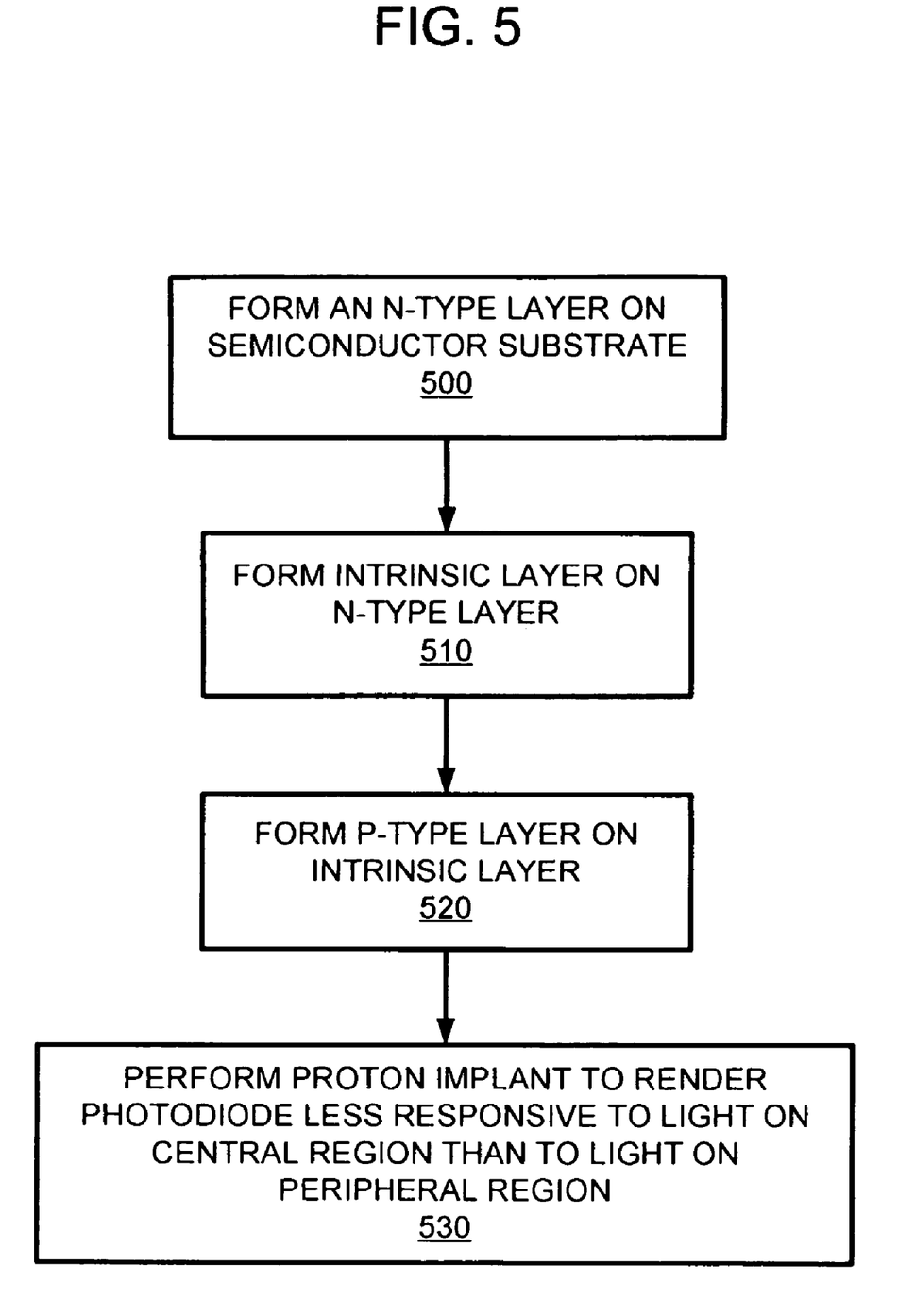
FIG. 5 is a flow chart of a method of fabricating a photodiode, including a mask above, on, or in the central region, being irradiated from the end of a multimode optical fiber by light composed of higher order mode groups and lower order mode groups.

FIG. 5 shows a flow chart of a process of fabricating one embodiment of a photodiode of the present invention. At 500, an n-type layer is formed on a semiconductor substrate. At 510, an intrinsic layer is formed on the n-type layer. At 520, a p-type layer is formed on the intrinsic layer. At 530, a proton implant is performed to render the photodiode less responsive, or unresponsive, to light on the central region as compared to light on the peripheral region.

While FIGS. 4 and 5 illustrate an n-type layer 455 formed directly on the substrate 445, the intrinsic layer 455 directly on the n-type layer 450, and the p-type layer 460 directly on the intrinsic layer 455, it should be understood that other epitaxies may also be used. For example, the layer order could be reversed with the p-type layer 460 directly on the substrate 445, the intrinsic layer 455 directly on the p-type layer 460 and the n-type layer 450 directly on the intrinsic layer 455. Additionally, when forming or formed on is used herein, they do not require a direct connection. Other intervening layers may exist between a layer and a structure on which it is formed. For example, as used herein, a recitation of "forming an n-type layer on a semiconductor substrate" allows for the n-type layer to be formed directly on the substrate, or directly on intervening layers that are formed on the substrate.

Figure 6:
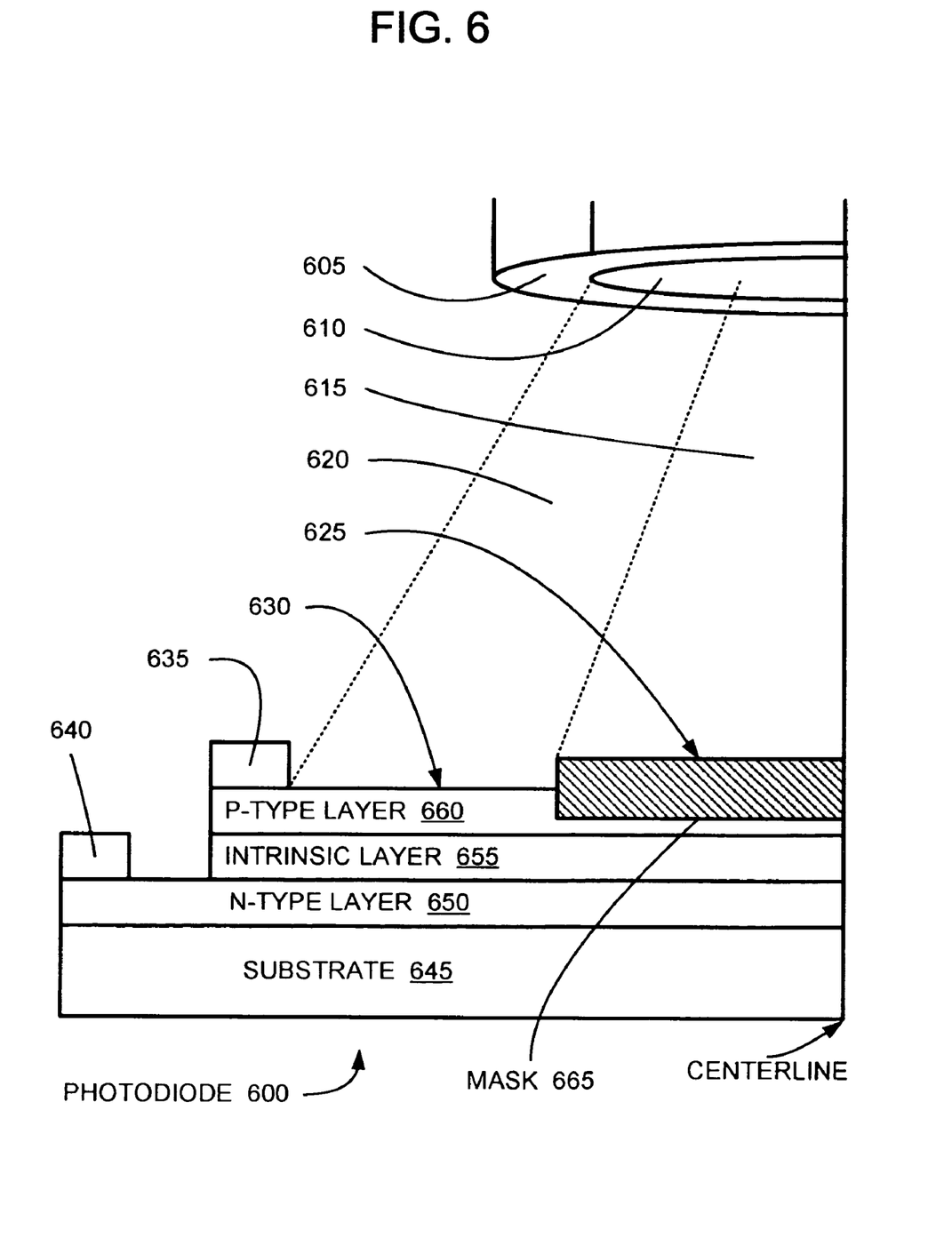
FIG. 6 depicts the photodiode device being irradiated from the end of a multimode optical fiber by light composed of higher order mode groups and lower order mode groups in accordance with an embodiment of the invention.

FIG. 6, illustrates an alternative embodiment of a photodiode of the present invention.

The photodiode 600 comprises a substrate 645, an n-type layer 650 on the substrate 645, an intrinsic layer 655 on the n-type layer 650 and a p-type layer 660 on the intrinsic layer 655. A cathode contact 640 and an anode contact 635 are coupled to the n-type layer 650 and the p-type layer 660, respectively. The photodiode 600 has a surface comprising a central region 625 and a peripheral region 630.

A fiber cable having cladding 605 and a core 610 is configured such that the high order mode groups 620 and low order mode groups 615 are emitted to be incident on the peripheral region 630 and the central region 625, respectively.

The photodiode 600 is rendered less responsive, or unresponsive, to incident light on the central region than the incident light on the peripheral region by forming a mask 665 over the central region 625. The mask 665 substantially prevents the photodiode 600 from responding to light incident on the central region 625. Therefore, the photodiode 600 responds preferentially to the higher order mode groups 620, and is less responsive to the lower order mode groups 615 because the lower order mode groups are incident on the less responsive central region 625 while the higher order mode groups are incident on the peripheral region 630.

In one embodiment, the mask 665 comprises a metal that reflects incident light. It will be apparent to one skilled in the art that other opaque materials can be used. It will be apparent that the mask 665 may be formed in alternative configurations to substantially reduce responsiveness to light incident on the central region 625.

Figure 7:
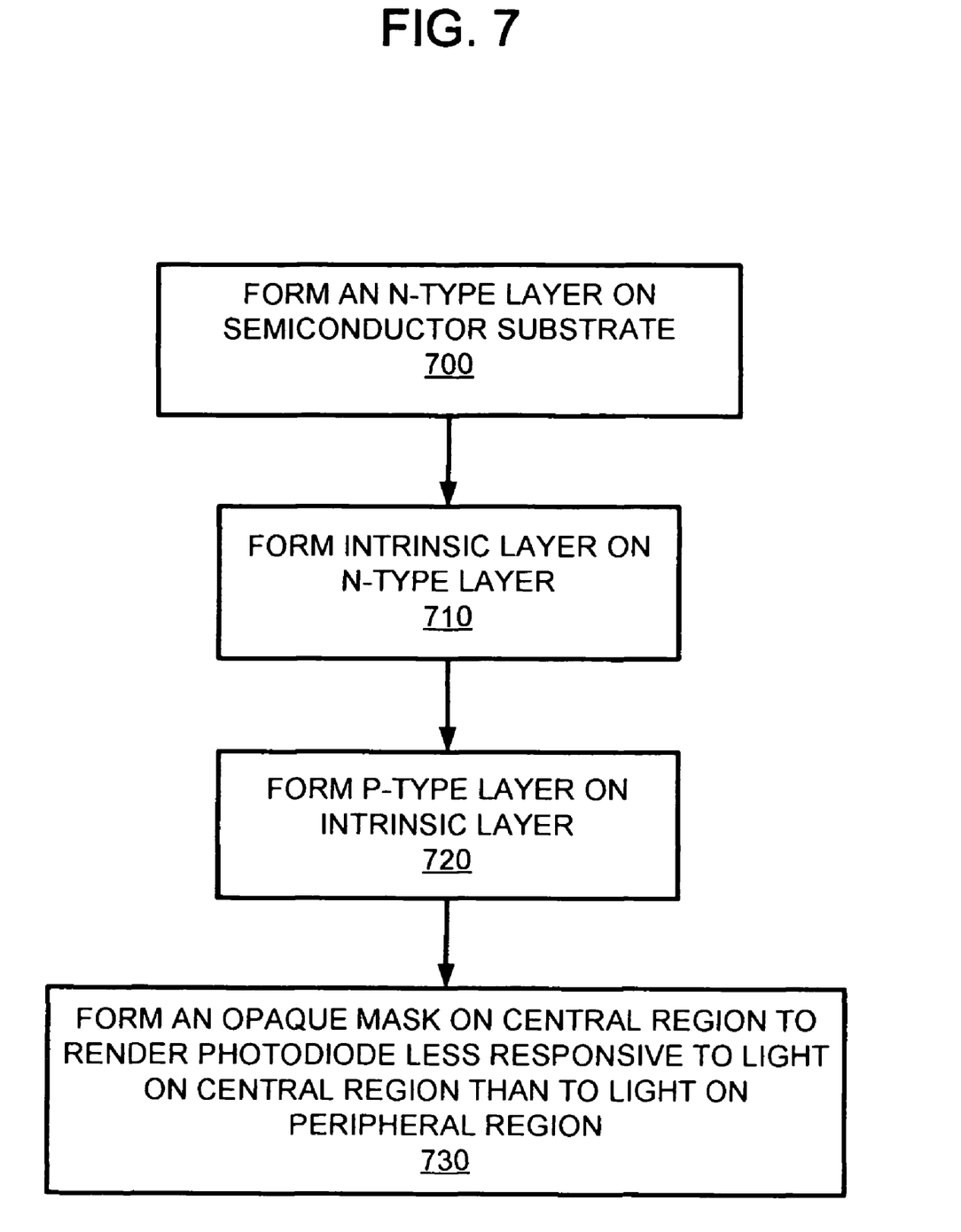
FIG. 7 is a flow chart of a method of fabricating a photodiode including an opaque mask in accordance with an embodiment of the invention.

FIG. 7 shows a flow chart of a process of fabricating a photodiode with a mask at the central region. At 700, an n-type layer is formed on a semiconductor substrate. At 710, an intrinsic layer is formed on the n-type layer. At 720, a p-type layer is formed on the intrinsic layer. At 730, an opaque mask is formed on the central region to render the photodiode less responsive to incident light on the central region than to incident light on the peripheral region.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. A method of fabricating a photodiode on a semiconductor substrate, the photodiode having a surface having a central region and a peripheral region, comprising:
    forming an n-type layer on the semiconductor substrate;
    forming an intrinsic layer on the semiconductor substrate coupled to the n-type layer;
    forming a p-type layer on the semiconductor substrate coupled to the intrinsic layer; and
    forming the peripheral region that is concentric with the central region, wherein the peripheral region is optically sensitive to light and the central region is made at least partially optically dead, thereby rendering the photodiode less responsive to incident light on the central region than to incident light on the peripheral region, the incident light including higher order mode groups and lower order mode groups, wherein the peripheral region and the central region are sized and configured such that the lower order mode groups are incident substantially on the central region.

2. the method of claim 1, wherein rendering the photodiode less responsive to incident light on the central region than to incident light on the peripheral region comprises performing proton implantation penetrating at least a portion of the p-type layer, the intrinsic layer, and the n-type layer in the central region.

3. The method of claim 1, wherein rendering the photodiode less responsive to incident light on the central region than to incident light on the peripheral region comprises performing oxygen implantation penetrating at least a portion of the p-type layer, the intrinsic layer, and the n-type layer in the central region.

4. The method of claim 1, wherein rendering the photodiode less responsive to incident light on the central region than to incident light on the peripheral region comprises masking the central region with opaque material.

5. The method of claim 1, wherein rendering the photodiode less responsive to incident light on the central region than to incident light on the peripheral region comprises masking the central region with metal.

6. The method of claim 1, wherein rendering the photodiode less responsive to incident light on the central region than to incident light on the peripheral region comprises rendering the photodiode unresponsive to incident light in the central region.

7. The method of claim 1, wherein the method further comprises:
    forming a cathode contact on the n-type layer; and
    forming an anode contact on the p-type layer.

8. A photodiode comprising:
    an n-type layer;
    an intrinsic layer coupled to the n-type layer;
    a p-type layer coupled to the intrinsic layer;
    wherein the photodiode has a region comprising a central region and a peripheral region, wherein the peripheral region is optically sensitive to light and the central region is at least partially optically dead such that the photodiode is less responsive to incident light on the central region than to incident light on the peripheral region, the incident light including higher order mode groups and lower order mode groups, wherein the peripheral region is concentric with the central region such that the lower order mode groups are incident substantially on the central region.

9. The device of claim 8, wherein the photodiode further comprises a proton implant penetrating at least portions of the p-type layer, the intrinsic layer, and the n-type layer in the central region.

10. The device of claim 8, wherein the photodiode further comprises an oxygen implant penetrating at least portions of the p-type layer, the intrinsic layer, and the n-type layer in the central region.

11. The device of claim 8, wherein the central region comprises an opaque mask.

12. The device of claim 8, wherein the central region comprises metal.

13. The device of claim 8, wherein the photodiode is substantially unresponsive to incident light on the central region.

14. The device of claim 8, wherein the photodiode further comprises:
    a cathode contact coupled to the n-type layer; and
    an anode contact coupled to the p-type layer.

15. A method for receiving information through a multimode fiber, comprising:
    receiving an optical signal having higher order mode groups and lower order mode groups from the multimode fiber onto a surface of a receiver having a central region and a peripheral region, the lower order mode groups being incident substantially on the central region; and
    generating an output electrical signal in response to incident light on the peripheral region, while being less responsive to incident light on the central region than to incident light on the peripheral region due to proton implantation in the central region.

16. The method of claim 15, further comprising processing the electrical signal in a circuit.

17. The method of claim 15, wherein the receiver is substantially unresponsive to incident light on the central region.

* * * * *

UNITED STATES PATENT AND TRADEMARK OFFICE
CERTIFICATE OF CORRECTION

PATENT NO. : 7,638,351 B2  Page 1 of 1
APPLICATION NO. : 11/185038
DATED : December 29, 2009
INVENTOR(S) : Jimmy A. Tatum It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 233 days.

Signed and Sealed this

Ninth Day of November, 2010

David J. Kappos
*Director of the United States Patent and Trademark Office*